(12) United States Patent
Krause

(10) Patent No.: US 11,218,128 B2
(45) Date of Patent: Jan. 4, 2022

(54) INTERFERENCE SUPPRESSOR FOR A DIRECT CURRENT CIRCUIT

(71) Applicant: BRUSA Elektronik AG, Sennwald (CH)

(72) Inventor: Axel Krause, Nesslau (CH)

(73) Assignee: Brusa Elektronik AG, Sennwald (CH)

( * ) Notice: Subject to any disclaimer, the term of this patent is extended or adjusted under 35 U.S.C. 154(b) by 502 days.

(21) Appl. No.: 16/048,227

(22) Filed: Jul. 28, 2018

(65) Prior Publication Data

US 2019/0036506 A1   Jan. 31, 2019

(30) Foreign Application Priority Data

Jul. 28, 2017  (DE) .................. 10 2017 117 183.5

(51) Int. Cl.

| | |
|---|---|
| *H03H 7/06* | (2006.01) |
| *H02M 1/14* | (2006.01) |
| *H02J 1/02* | (2006.01) |
| *B60R 16/033* | (2006.01) |
| *G01R 15/18* | (2006.01) |
| *G01R 19/165* | (2006.01) |

(52) U.S. Cl.
CPC ............. *H03H 7/06* (2013.01); *B60R 16/033* (2013.01); *G01R 15/183* (2013.01); *G01R 19/1658* (2013.01); *H02J 1/02* (2013.01); *H02M 1/143* (2013.01)

(58) Field of Classification Search
CPC .. H03H 7/06; H02M 1/143; H02J 1/02; B60R 16/033; G01R 15/183; G01R 19/1658
See application file for complete search history.

(56) References Cited

U.S. PATENT DOCUMENTS

| | | | |
|---|---|---|---|
| 9,423,442 B2* | 8/2016 | Henke ................... | G01R 31/50 |
| 2004/0239055 A1* | 12/2004 | Bender ................ | H03H 7/0115 |
| | | | 280/5.5 |
| 2005/0141248 A1 | 6/2005 | Sudip et al. | |

(Continued)

FOREIGN PATENT DOCUMENTS

| | | |
|---|---|---|
| DE | 433673 C | 9/1926 |
| DE | 1203839 B | 10/1965 |

*Primary Examiner* — Jared Fureman
*Assistant Examiner* — Duc M Pham
(74) *Attorney, Agent, or Firm* — Moser Taboada

(57) ABSTRACT

The invention relates to an interference suppressor for a direct current circuit, a vehicle component, a high-voltage intermediate circuit and a vehicle. The interference suppressor for a direct current circuit, which comprises two conductors, is characterized in that the interference suppressor comprises a first connection for connecting the interference suppressor to a first conductor of the direct current circuit; a second connection for connecting the interference suppressor to a second conductor of the direct current circuit; a sensor, wherein the sensor can be coupled in noncontact manner to the direct current circuit and is designed to detect the passing of a predetermined limit value of a superimposed alternating voltage in the first conductor of the direct current circuit; and is designed, by impressing a current in the first connection, to reduce the alternating voltage in the first conductor of the direct current circuit substantially to the predetermined limit value.

11 Claims, 7 Drawing Sheets

(56) References Cited

U.S. PATENT DOCUMENTS

| | | | |
|---|---|---|---|
| 2006/0284487 A1* | 12/2006 | Tang | H02P 25/098 307/9.1 |
| 2010/0156194 A1 | 6/2010 | Navid et al. | |
| 2013/0002208 A1* | 1/2013 | Rozenboim | H02J 7/0045 320/162 |
| 2018/0203074 A1* | 7/2018 | Devaal | G01R 31/389 |
| 2018/0342947 A1* | 11/2018 | Werker | H05K 1/14 |

* cited by examiner

INTERFERENCE SUPPRESSOR FOR A DIRECT CURRENT CIRCUIT

CROSS-REFERENCE TO RELATED APPLICATIONS

This application claims priority to and the benefit of German Patent Application No. 10 2017 117 183.5, filed on Jul. 28, 2017, the disclosure of which is incorporated herein by reference in its entirety.

FIELD OF THE INVENTION

The present invention relates to the technical field of direct current networks. In particular, the present invention relates to an interference suppressor for a direct current circuit, a vehicle component, a high-voltage intermediate circuit and a vehicle.

BACKGROUND

A circuit serves to supply electrical energy to various components. A single component may be operated on a circuit; but often a plurality of components are operated, as is often the case for example in an electric or hybrid vehicle. Components were are operated on a direct current circuit, however, are vulnerable to interference, especially to alternating voltages which arise on the direct current circuit for different reasons or are coupled into the direct current circuit from the outside and propagate on the direct current circuit.

The susceptibility to interference of a component may be caused by the fact that filter components, which are actually provided to suppress interference which is generated by the component upon occurrence of interference on the direct current circuit, especially upon occurrence of an alternating voltage with a particular frequency, are excited such as to result in a destruction of the component or individual parts of the component.

Publication DD 208 019 relates to a decreasing of the current load of additional choke coils which are present in a direct current system for limiting the current in event of a fault and across which the full load current also flows, for a voltage inverter to energize rotary current machines.

One problem which the present invention proposes to solve is to make possible an effective protection for a component.

SUMMARY

Accordingly, there are indicated an interference suppressor for a direct current circuit, a vehicle component, a high-voltage intermediate circuit and a vehicle.

The subject matter of the invention is indicated by the features of the independent patent claims. Sample embodiments and further aspects of the invention are indicated by the dependent claims and the following specification.

According to one aspect of the invention, an interference suppressor is indicated for a direct current circuit. The direct current circuit has at least two conductors. The interference suppressor has a first connection, which serves for the connecting of the interference suppressor to a first conductor of the direct current circuit, and a second connection, which serves for the connecting of the interference suppressor to a second conductor of the direct current circuit. Furthermore, the interference suppressor has a sensor. The sensor can be coupled in substantially noncontact manner to the direct current circuit. In one example, the quality of "noncontact" may indicate a galvanic coupling, as a mechanical contact by a winding core of a transformer is entirely possible. In another example, a substantially complete air coupling to the direct current circuit may be produced, so that there is substantially no mechanical coupling between the sensor and the direct current circuit—apart from connections by a common connection. In particular, such a connection does not exist for the transmitting of a measured quantity, such as the alternating current flowing in the direct current circuit. Or in other words, an alternating current flowing in the direct current circuit may be transmitted in substantially noncontact manner by the coupling.

The sensor is also designed to detect the passing of a predetermined limit value of a superimposed alternating voltage in the first conductor of the direct current circuit and, by impressing a current in the first connection, to reduce the alternating voltage in the first conductor of the direct current circuit substantially to the predetermined limit value and/or below the limit value. In one example, the current is inductively picked up but conductively impressed in the direct current circuit, for example, by diodes.

According to another aspect of the invention, a component is indicated, especially a vehicle component. The component can be, for example, a drive inverter, an onboard power converter, a charging device, an air conditioning compressor or an inverter. The component has a direct current circuit with a first conductor, a second conductor, and an intermediate circuit filter. Furthermore, the interference suppressor according to the invention is present in or at the component, while the first connection of the interference suppressor is connected to the first conductor, the second connection of the interference suppressor is connected to the second conductor, and the sensor is coupled substantially in noncontact manner to the intermediate circuit filter. Moreover, the direct current circuit is designed for connecting to a high-voltage intermediate circuit.

According to yet another aspect of the invention, a high-voltage intermediate circuit for a vehicle is indicated. This high-voltage intermediate circuit has a power supply battery, a first component, which is operated with a working frequency, and at least one second component. Moreover, the high-voltage intermediate circuit has at least one interference suppressor according to the invention. The power supply battery, the first component and the second component are respectively connected to a first conductor and a second conductor of the high-voltage intermediate circuit.

The first conductor of the at least one second component is connected to the first connection of the interference suppressor and the second conductor of the at least one second component is connected to the second connection of the interference suppressor. Furthermore, the sensor of the interference suppressor is coupled in noncontact manner to the part of the first conductor and/or second conductor belonging to the at least one second component.

The interference suppressor may also be called a resonant power regeneration circuit. In this text, the terms "capacitor" and "capacitance" as well as "coil" or "choke coil" and "inductance" are used as equivalent and should not be interpreted restrictively.

When components are ordered by an OEM (Original Equipment Manufacturer) from a supplier, the OEM establishes a maximum allowable amplitude, which must not be surpassed within a likewise given frequency range. If these amplitudes are surpassed, the component might be damaged or destroyed. In order to prevent a disruption originating in the component at other components which are hooked up to the same circuit, the component itself may have an intermediate circuit filter, where the filter contains at least one intermediate circuit capacitor and at least one intermediate circuit coil or an intermediate circuit choke coil. This intermediate circuit filter may be designed as a low-pass filter. This low-pass filter may have a resonance frequency, which lies far below the clock frequency with which the respective component is functioning, e.g., a drive inverter, an onboard power converter, a charging device, or an air conditioning compressor. By the design for the working frequency of the component such that this frequency lies far above the resonance frequency of the low pass and as far as possible outside the pass band of the low pass, it may be ensured that interference, especially alternating current (AC) interference or voltage ripples generated by the component, are dampened and propagate if possible not at all, or as little as possible, into the direct current circuit and/or the intermediate circuit to which the component is connected.

Despite these precautionary measures, however, it may happen that interference in the form of alternating voltages (AC) or voltage ripples will arise at the intermediate circuit having a frequency which is lower than the working frequency of a component, yet lying in the resonance frequency range of the intermediate circuit filter belonging to the component. Such interference is then able to generate resonance oscillations in the filter, which may lead to a voltage surge which in turn can damage parts of the component, since the voltage surge is oriented in the direction of the internal parts of the component. Or in other words, the construction of a filter component, such as a filter of second or higher order, may dampen interference in the range of the working frequency of the component propagating from the component in the direction of the intermediate circuit; yet it may amplify oscillations (AC) of low frequency, which propagate in the intermediate circuit in the direction of the internal parts of the component and which have a frequency in the range of the resonance frequency so that they may result in damage to the parts of the components. Or in yet other words, the intermediate circuit filter dampens alternating (AC) interference in the area of the working frequency of the component in the direction of the intermediate circuit, yet amplifies alternating (AC) interference having a frequency in the area of the resonance frequency and propagating from the intermediate circuit in the direction of the component and especially in the direction of the internal region of the component.

While the interference propagating from the intermediate circuit in the direction of the component can be suppressed by dampening with the aid of additional filters and/or a filter designed for a correspondingly large frequency range, the filters would need to be designed correspondingly large, which would increase the weight and costs of the filter. Furthermore, the dampening involves energy losses and might result in large losses. With the aid of the interference suppressor according to the invention, however, the current produced by the voltage surge can be utilized by feeding it back into the intermediate circuit or direct current circuit or impressing it in them, and the energy contained in it is substantially preserved, i.e., not destroyed.

According to another aspect of the present invention, the sensor for the noncontact coupling to the first conductor of the direct current circuit comprises a coil in order to form, with the direct current circuit, a transformer with a predetermined coupling factor.

By means of the coil, a current can be picked off substantially loss-free in the interference suppressor, which can be fed back into the direct current circuit or the intermediate circuit in order to counteract the interference. The interference suppressing coil can be wound on a common ferrite core with the intermediate circuit filter coil. The coils are substantially galvanically separated, especially in regard to the voltage transmission. The coupling factor k indicates how much the coupling conforms to an ideal coupling. For an ideal coupling, the coupling factor is k=1, i.e., the entire magnetic flux through the primary coil corresponds to the flux through the secondary coil. In a real coupling, a stray flux may occur, so that k<1, for example, it might be k=0.9. The winding ratio of the interference suppressing coil to the intermediate circuit filter coil may be for example 1:10 or 1:20, independently of the coupling factor k.

According to another aspect of the present invention, a first connection of the coil, especially a first connection of the interference suppressing coil, is connected to the first connection and a second connection of the coil is connected across at least one capacitor, especially across the interference suppressing capacitor, and across at least one diode, to the first connection.

Thanks to this kind of circuitry for the interference suppressing coil, a current picked off by means of the interference suppressing coil can be impressed in the first connection and thus on the intermediate circuit and/or be fed back.

According to another aspect of the present invention, a connection of the at least one capacitor, especially the interference suppression capacitor, is connected across a diode to the second connection.

The second connection may be a reference potential, such as ground.

According to another aspect of the present invention, the first connection and the second connection are designed for connection to a vehicle component.

If the interference suppressor is intended for retrofitting in an intermediate circuit, the first and the second connection may occur for example by means of a usual plug connection for intermediate circuits, which greatly simplifies the retrofitting of an intermediate circuit with the interference suppressor. In addition, for the connecting of the interference suppressor to the first conductor and to the second conductor it may be necessary to place the interference suppressing coil in proximity to the intermediate circuit, in order to provide a good coupling factor.

According to another aspect of the present invention, the direct current circuit comprises a filter coil and/or a power inductance, to which the sensor can be coupled in noncontact manner. In order to increase the effectiveness of a coupling, the feed line may be led through at least one toroid. If the feed line is led through one or more toroids which are wound with the interference suppressing coil, this power inductance acts as an intermediate circuit filter coil, since the power inductance is amplified by the one or more toroids.

Depending on the configuration of the power inductances, not only the filter coil or intermediate circuit filter coil but also the power inductances need to be taken into account, such as contribute to the coupling and/or to the interference by the impressed alternating voltage (AC). These should be considered in the dimensioning of the interference suppressing coil or the determination of the number of windings.

According to another aspect of the present invention, the direct current circuit or direct current intermediate circuit has a d.c. voltage of 400 V or 900 V.

According to another aspect of the present invention, the interference suppressor comprises a housing, and the housing is designed for fastening on a vehicle.

The housing may be a robust housing, meeting the standards for installation of extra components in a vehicle, especially an electric vehicle.

According to another aspect of the present invention, an interference suppressor or an electric LC filter can be indicated which is connected to a direct current network or intermediate circuit. The intermediate circuit may comprise a plurality of inductances and capacitances, which are formed substantially by the intermediate circuit filters of the components connected to the direct current network. Upon excitation with an alternating voltage with a defined frequency above a defined amplitude, the oscillatory circuit amplitude of the LC filter is limited and the energy of the interference suppressor, the oscillatory circuit or the LC filter may be fed back as direct current into the direct current network. For each frequency, a different maximum allowable amplitude may be provided. In particular, if the intermediate circuit filters of different components have different resonance frequencies and/or different maximum allowable amplitudes or voltage amplitudes, a different maximum allowable amplitude may be specified for each frequency. For an individual interference suppression for each component, each component separately hooked up on the HV bus (high-voltage bus, intermediate circuit) is individually noise suppressed. In order to define a component, for example, the housing may be established as the component boundary. In this way, it is possible, if several components are present in the same housing, to jointly suppress the interference of the joint connection to the HV bus for all components.

Essentially, the invention is based on the knowledge that an oscillatory circuit, which is supposed to prevent the propagation of interference from one component in the direction of other components, passes on interference more intensely to the component when interference in the opposite direction from other components affects the oscillatory circuit. Or in other words, this means that an oscillatory circuit behaves asymmetrically at different frequencies in different directions.

BRIEF DESCRIPTION OF THE DRAWINGS

In the following, further exemplary sample embodiments of the present invention shall be described with reference to the figures.

DETAILED DESCRIPTION

The representations in the figures are schematic and not drawn to scale. In the following description of FIG. 1 to FIG. 6, the same reference numbers are used for the same or corresponding elements.

Figure 1:
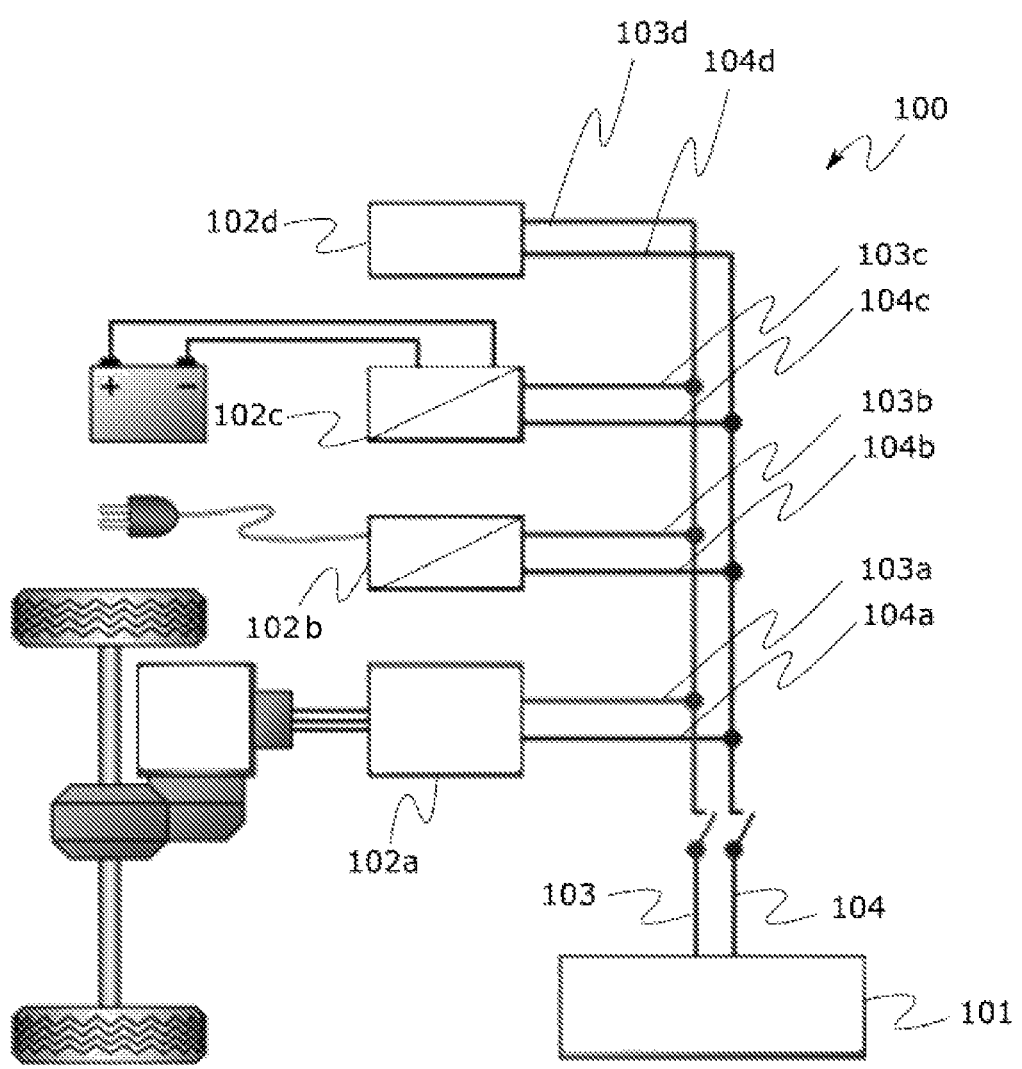
FIG. 1 shows a high-voltage intermediate circuit with connected components according to one exemplary sample embodiment of the present invention.

FIG. 1 shows an intermediate circuit 100 or HV bus 100 with connected components 102a, 102b, 102c, 102d according to one exemplary sample embodiment of the present invention. The high-voltage intermediate circuit 100 of an electric and hybrid vehicle comprises a first line 103 and a second line 104. These are energized by the battery 101, for example a Li-ion battery, with a d.c. voltage (Direct Current) of 400 V, 450 V or 900 V. The voltages may be arbitrarily chosen. Without limiting the generality, voltages of 300 V, 350 V, 400 V, 450 V, 500 V, 550 V, 600 V, 650 V, 700 V, 750 V, 800 V, 850 V and 900 V may also be chosen. In particular, any desired voltages from the range of 300 V to 900 V are also possible. The voltages may also be present within a tolerance range of the indicated values. To the high-voltage intermediate circuit 100 are connected several components 102a, 102b, 102c, 102d. The components involve the high-voltage battery 101, the drive inverter 102a, which is connected to the motor, the onboard power converter 102b, the charging unit 102c or the DC-DC converter 102c, the AC/DC converter 102d, the air conditioning compressor inverter and many other components as desired. With the exception of the battery 101, electronic converters are present in these components 102a, 102b, 102c, 102d, which periodically load the intermediate circuit 100 with a clock frequency in the range of 5 to 500 kHz with sometimes heavy currents. These converters have switches which are operated according to the particular clock frequency of the respective component.

Figure 2:
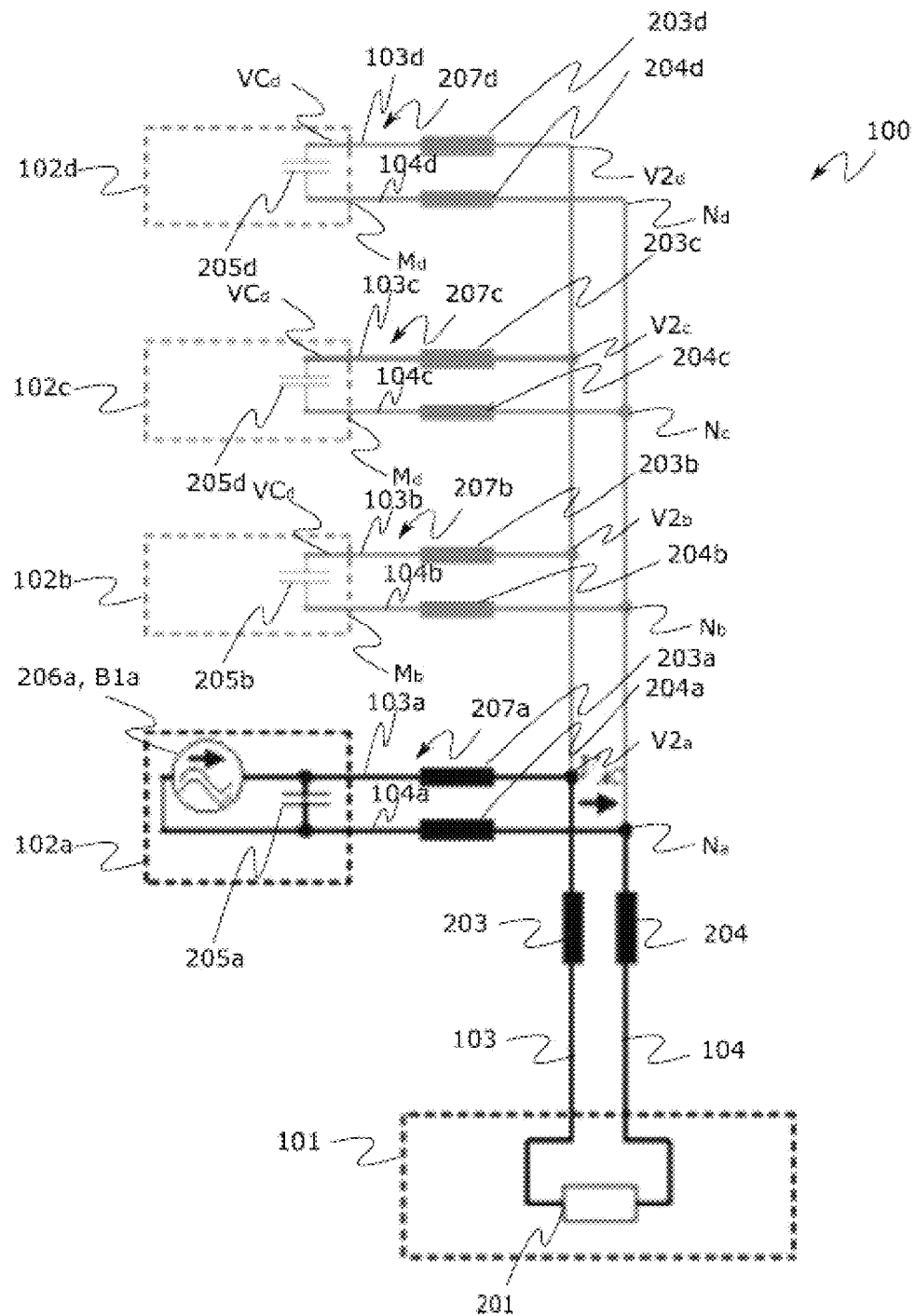
FIG. 2 shows a partial equivalent circuit of the filter units of the components of the intermediate circuit of FIG. 1 according to one exemplary sample embodiment of the present invention.

FIG. 2 shows a partial equivalent circuit of the filter units of the components 101, 102a, 102b, 102c, 102d of the intermediate circuit 100 from FIG. 1 according to one exemplary sample embodiment of the present invention. FIG. 2 shows in particular a partial equivalent circuit resulting for an interference alternating voltage 206a which may occur in the inverter 102a on account of switching events. In each of the components 102a, 102b, 102c, 102d having a switch which is operated with a particular frequency, loads or interference may be formed by the switching in the form of an alternating voltage (AC) 206a or a voltage ripple 206a. The interference voltage 206a, in particular the interference alternating voltage 206a, may be viewed as a voltage source 206a, B1a.

FIG. 2 shows the formation of an interference in the case of the inverter 102a for the power supply of a 100 kW drive motor for an electric vehicle, which acts as a generator to produce a drive current of 400 A for the drive motor of the vehicle. The interference current 206a is picked up by the intermediate circuit capacitor 205a, thereby producing an interference voltage on the intermediate circuit 100, 103, 104 or on the HV-DC bus 100, 103, 104, which may in theory excite all the connected filter circuits to oscillate. The interference 206a caused in this way may propagate, starting at the originating component 102a, in the direction of the intermediate circuit 100 and reach the respective other components 102b, 102c, 102d by way of the intermediate circuit 100. The intermediate circuit 100 or DC bus 100 is operated as a direct current circuit (DC). The battery 101 generates a d.c. voltage VB of 400 V, 450 V or 900V, for example, on which the interference alternating voltage VAC is superimposed. In order for this load caused by the interference alternating voltage 206a not to affect the functioning of other components 102b, 102c, 102d connected to the intermediate circuit 100, the inverter 102a has an intermediate circuit filter 207a, comprising the intermediate circuit filter capacitor 205a and the positive intermediate circuit filter coil 203a corrected to the positive conductor 103a or first conductor 103a and the negative intermediate circuit filter coil 204a connected to the negative conductor 104a or second conductor 104a.

Such an intermediate circuit filter 207a, 207b, 207c, 207d is present in each component 102a, 102b, 102c, 102d, which may serve as potential interference producers. But it may also be arranged alternatively or additionally at the component connections of the intermediate circuit and thus belong to the intermediate circuit. Components 102a, 102b, 102c, 102d may share an intermediate circuit filter when they are located close to one another in the same housing and are connected by a common feed line to the intermediate circuit 100. The intermediate circuit capacitor 205a, 205b, 205c, 205d of an intermediate circuit filter is arranged as close as possible to the active switch elements (not shown in FIG. 2) of the respective component 102a, 102b, 102c, 102d. Hence, there is also present in each of these components 102a, 102b, 102c, 102d an intermediate circuit capacitor 205b, 205c, 205d or intermediate circuit filter capacitor 205b, 205c, 205d with a capacitance in the range of 10 to 1000 µF. Moreover, these components 102b, 102c, 102d are connected across filter inductances 203b, 204b, 203c, 204c, 203d, 204d, intermediate circuit filter inductances 203b, 204b, 203c, 204c, 203d, 204d or intermediate circuit inductances 203b, 204b, 203c, 204c, 203d, 204d to the intermediate circuit 100. The battery 101 has an internal resistance 201 of 0.1Ω, which produces a dampening for the oscillatory circuit formed. The intermediate circuit 100 furthermore has a power inductance 203 in the positive bus line 103 and a power inductance 204 in the negative bus line 104.

The intermediate circuit filters 207a, 207b, 207c, 207d form a low-pass filter by the interconnecting of the respective filter capacitors 205b, 205c, 205 to the respective filter inductances 203b, 204b, 203c, 204c, 203d, 204d, which is designed to filter out interference in the range of the typical clock frequency of the respective component and the interference generated by it, and which heavily dampens interference with frequencies in this frequency range. Since the low-pass filter so formed is a filter of second order, each filter has a resonance frequency. This resonance frequency $f_0$ of each of the intermediate circuit filters 207a, 207b, 207c, 207d is calculated by the formula $$f_0 = \frac{1}{2\pi\sqrt{LC}},$$

where the inductance L comes from the interconnection of the respective positive and negative intermediate circuit filter coils 203a, 204a, 203b, 204b, 203c, 204c, 203c, 204c and the capacitance C corresponds to the respective capacitance of the corresponding intermediate circuit filter capacitors 205a, 205b, 205c, 205d.

This resonance frequency $f_0$ lies below the typical clock frequency of the component for which the intermediate circuit filter 207a, 207b, 207c, 207d is designed. The resonance frequency $f_0$ therefore lies in the pass band region of the intermediate circuit filter. Consequently, the intermediate circuit filter 207a, 207b, 207c, 207d constitutes not only a damping device for the interference generated by the respective components, but also forms an oscillatory circuit, comprising the intermediate circuit filter capacitor 205a, 205b, 205c, 205d, the intermediate circuit filter coil and possibly also further contributions from the inductance of the feed line.

In the intermediate circuit 100 of FIG. 2, in which no interference suppressor is used, the inductances of the feed lines with the respective intermediate circuit filter capacitor 205a, 205b, 205c, 205d contribute to the transmission of interference in the direction of the component 102a, 102b, 102c, 102d. The power inductance 203a, 204a, 203b, 204b, 203c, 204c, 203c, 204c, however, is hard to localize. This is indicated in FIG. 2 as a coil component 203a, 204a, 203b, 204b, 203c, 204c, 203c, 204c. In order to localize the power inductance in a practical exemplary realization, and to situate the interference suppressing coil at this position, the feed line 103a, 104a, 103b, 104b, 103c, 104c, 103d, 104d can be led through a toroid and/or a plurality of toroids (not shown in FIG. 2). This toroid may also be used to boost the efficiency of a coupling. If the feed line is led through the toroid, which is wound with the interference suppressing coil, this power inductance acts as an intermediate circuit filter coil 203a, 204a, 203b, 204b, 203c, 204c, 203d, 204d, since the power inductance is increased by means of the toroids. The intermediate circuit filter coil 203a, 204a, 203b, 204b, 203c, 204c, 203c, 204c led through the toroid may also be designated as the coil L2. The interference suppressing coil wound around the toroid may be designated as L3.

For the designing of suitable interference suppressors for the intermediate circuit filters 207a, 207b, 207c, 207d, the constituents of the individual intermediate circuit filters 207a, 207b, 207c, 207d are taken into account. While the intermediate circuit filters 207a, 207b, 207c, 207d are all excited in common by the same interference source 206a, B1a, the exciting circuit 102a which contains the interference source 206a, B1a in a particular realization often has so low an impedance as compared to the other filter circuits 207b, 207c, 207d that the filter circuits 207b, 207c, 207d excited by the interference circuit 207a can be considered in an approximation as being decoupled from one another. Since all of the intermediate circuit filters 207a, 207b, 207c, 207d are connected across the intermediate circuit 100, their intermediate circuit filter capacitors 205a, 205b, 205c, 205d with the intermediate circuit filter coils 203a, 204a, 203b, 204b, 203c, 204c, 203d, 204d and possibly with the power inductances 203a, 204a, 203b, 204b, 203c, 204c, 203d, 204d form a network of oscillatory circuits 207a, 207b, 207c, 207d. In the sample embodiment of FIG. 2, only intermediate circuit filter capacitors 205a, 205b, 205c, 205d are represented. In this case, the intermediate circuit filter capacitors 205a, 205b, 205c, 205d may also be called intermediate circuit capacitors. In another sample embodiment, intermediate circuit capacitors may be present in addition to the intermediate circuit filter capacitors (IF filter capacitors). An intermediate circuit capacitor is defined here as a capacitor which is connected directly to the switches, especially the semiconductor switches, of the components 102a, 102b, 102c, 102d, while an IF filter capacitor 205a, 205b, 205c, 205d or intermediate circuit filter capacitor 205a, 205b, 205c, 205d is connected downstream of a filter choke 203a, 204a, 203b, 204b, 203c, 204c, 203d, 204d in order to form a filter circuit 207a, 207b, 207c, 207d.

Intermediate circuit filter capacitors and additional intermediate circuit capacitors are present for example in multistage filters.

Since different components are often interconnected across the intermediate circuit and the components work with different frequencies and accordingly the individual components contain filters with different resonance frequencies, it may happen that the working frequency of one component, such as the inverter 102a, comes to lie precisely at the filter resonance frequency of another component, such as the onboard power converter 102c, and in particular at the resonance frequency of the intermediate circuit filter 207c. Therefore, the oscillatory circuit formed by the elements 203c, 204c, 205c of the intermediate circuit filter 207c would be excited in oscillations. The working frequency here corresponds to the typical clock frequency of the respective component. In the example described, the working frequency of the inverter 102a corresponds substantially to the resonance frequency $f_0$ of the intermediate circuit filter 107c of the onboard power converter 102c. And even if the intermediate circuit filter attuned to the working frequency of the interference component 102a suppresses the bulk of the interference, interference of a corresponding frequency may propagate onto the intermediate circuit 100.

The excitation of the filter resonance frequency in the intermediate circuit filter of the other component 102c may result in such high losses in the participating chokes, coils and/or capacitors of the intermediate circuit filters of the other component 102c, e.g., in the constituents of the onboard power converter 102c, that the constituents (not shown in FIG. 2) of the other component 102c are overloaded and fail. In other words, the excitation of a resonance frequency in an intermediate circuit filter may result in an amplitude surge of the oscillation, especially a voltage surge, which causes the individual constituents of the other component 102c to be overloaded, and they may fail in this manner. This voltage surge shall be described in FIG. 4, FIG. 5a and FIG. 5b. The components 102a, 102b, 102c, 102d are connected across the intermediate circuit filter 207a, 207b, 207c, 207d at the positive connection contacts V2a, V2b, V2c, V2d to the positive line 103 of the intermediate circuit 100 and across the negative connection contacts Na, Nb, Nc, Nd to the negative line 104 of the intermediate circuit 100.

Figure 3:
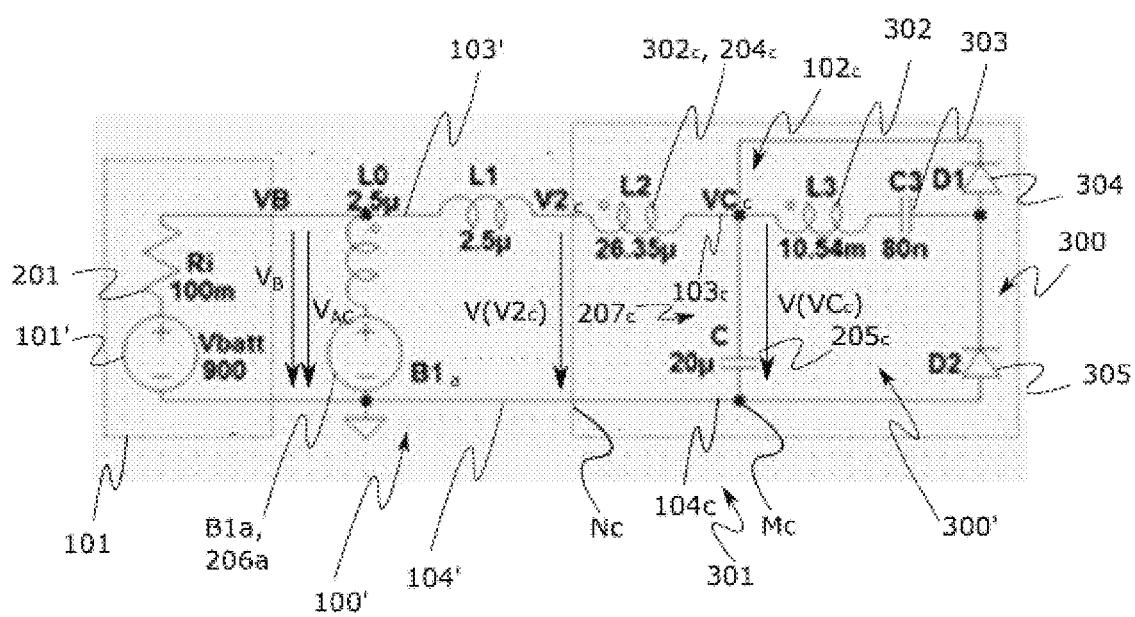
FIG. 3 shows an equivalent circuit for an interference suppressor, which is connected to an intermediate circuit and an intermediate circuit filter of a component.

FIG. 3 shows an equivalent circuit for an interference suppressor 300, which is connected to an intermediate circuit and an intermediate circuit filter of a component, according to one exemplary sample embodiment of the present invention. The overall circuit 301 of FIG. 3 is a simulation diagram, which basically simulates the influence of the interference 206a on a disrupted component 102c as well as an intermediate circuit filter 207c. Since the individual interferences differ in their frequencies, to which the respective intermediate circuit filter 207c responds with resonance, it is permissible to view each interference by an interference source B1a, 206a independently of the other interferences. All elements subordinate to the simulation of the interference, such as the interconnection of the intermediate circuit 100 with the intermediate circuit filters 207b, 207c, 207d that are not directly involved in the interference, are combined in the intermediate circuit 100' and especially in the lines 103'. The conductors 103c, 104c are connected to the respective conductors 103, 104 of the intermediate circuit 100.

The use of the interference suppressor 300 is a measure which can be utilized in order to reduce the amplitude of a resulting interference oscillation V(VCc) or a resulting voltage amplitude V(VCc) at the intermediate frequency filter output VCc, which is excited by an input interference oscillation $V_{AC}$, V(V2c) with a certain frequency at the intermediate circuit filter input V2c. The resulting interference oscillation V(VCc) which is generated at the intermediate frequency filter output VCc may for simplicity also be called the resulting interference amplitude V(VCc). The component which is to be protected by the interference suppressor 300 or the interference suppressing filter 300 is not shown in FIG. 3. But this component might be the onboard power converter 102c, as already mentioned in the description of FIG. 2. The component 102c being protected (not shown in FIG. 2), such as the onboard power converter 102c, would be connected at the connection VCc to the first conductor 103c and at the connection Mc to the second conductor 104c. The interference suppressor 300 is dimensioned such that the resulting amplitude of a voltage V(VCc) can be reduced, which is generated by an interference which is excited by an interference voltage from the intermediate circuit 100' across the intermediate circuit filter 207c, substantially oscillating in resonance, at the connection VCc and thus the voltage at the connection VCc, to which a component 102c being protected can be hooked up, is kept below a predetermined maximum value. The interference suppressor limits a resulting voltage amplitude at a component connection VCc, Mc to a value which is not harmful or which is acceptable for the component 102c and also keeps the associated power loss very low. This maximum value may be specified, for example, by an OEM for a particular frequency range.

An intermediate circuit LC filter 207c, comprising the intermediate circuit filter coil 203c, 204c, L2 and the intermediate circuit filter capacitor 205, C, is hooked up to a connection V2c, Nc to an intermediate circuit 100'. The intermediate circuit 100' is supplied by the power supply battery 101 or direct current source 101 with the intermediate circuit d.c. voltage VB=Vbatt−Ri*I with a d.c. voltage of 900 V, minus the voltage at Ri, which is caused by a current I flowing through Ri. The battery 101 comprises a voltage source 101' with a constant voltage Vbatt of 900 V and the internal resistance Ri, 201, which may be for example 100 mΩ. Periodic or alternating interference voltages $V_{AC}$ may be superimposed on this d.c. voltage VB. These interference voltages may be caused by switched components, which can excite periodic interference signals by their switching events. Even though the switched components have filters which are supposed to suppress the periodically excited interference, it may happen that the filters cannot totally eliminate all interference. The strongest interference might be produced by the components switching the largest power in an intermediate circuit 100'. An interference, an interference signal or an interference voltage may be superimposed on the existing d.c. voltage VB. The voltage which thus occurs on the intermediate circuit 100' is a d.c. voltage VB=900 V, on which is superimposed a periodic interference voltage of $V_{AC}$=20V*[sin(□)2πft) for example, where f is the clock frequency of the "excitation source". The largest "excitation source" is usually the inverter 102a, the interference caused by it being modeled in FIG. 3 as the voltage source B1, 206a.

For the simplified diagram in FIG. 3 it is now assumed that the two feed lines 103a, 104a, 103b, 104b, 103c, 104c, 103d, 104d of all components lead in "star pattern" to the battery 101 and are all connected there respectively at one connection point. The power inductances 203, 204 are not shown in FIG. 3.

The coil L0 is the combination of the inductances 203a, 204a including feed lines 103a, 104a going to the inverter 102a, and L1 is the combination of the inductances 203c, 204c and feed lines 103c, 104c going to the intermediate circuit filter 207c.

The interference suppressor 300 for the direct current circuit 100' or intermediate circuit 100', comprising two conductors 103c, 104c, has a first connection VCc for connecting the interference suppressor to the first conductor 103' of the direct current circuit 100', especially to a first conductor 103c of the intermediate circuit filter 207c of the component 102c being protected. Moreover, the interference suppressor 300 has a second connection Mc for connecting the interference suppressor 300 to a second conductor 104' of the direct current circuit 100', especially to a second conductor 104c of the intermediate circuit filter 207c of the component 102c being protected. The interference suppression filter 300 or the interference suppressor 300 is hooked up in parallel with the intermediate circuit filter capacitor 205c and in series with the intermediate circuit filter coil L2, 203c, 204c. This intermediate circuit filter coil L2, 203c, 204c is designed as a discrete element in the intermediate circuit filter 207c, so that this coil L2, 203c, 204c can be very precisely localized in the intermediate circuit filter.

The connections VCc, Mc of the interference suppression filter may have connection lines. Hooked up to the connections VCc, Mc, the interference suppressor 300 has a sensor 300', which is designed to mitigate an interference threatening the elements of the component 102c. The component 102c is likewise hooked up in parallel with the interference suppressor 300 at the connections VCc, Mc. For this counteracting or compensating, the sensor 300' is designed to recognize a surpassing of a predetermined limit value of a superimposed alternating voltage VAC in the first conductor 103', 103c of the direct current circuit 100' and especially in the intermediate circuit filter 207c. The sensor 300' moreover is separated galvanically or in noncontact manner and can be coupled to the direct current circuit 100' or intermediate circuit 100' and especially to the intermediate circuit filter 207c of the intermediate circuit 100'. By the arranging of a feed line 103c, 104c on a toroid, the coil L2 of the intermediate circuit filter is formed, to make possible an effective coupling with the sensor 300'. The sensor 300' is designed to impress a current in the first connection VCc and thereby reduce the resulting interference alternating voltage in the first conductor of the direct current circuit substantially to the predetermined limit value. In other words, the resulting voltage V(VCc) between the connections VCc and Mc is regulated below a maximum value by generating a current which can be impressed in the first sensor connection VCc in order to counteract the amplitude surge in event of an amplitude surge of the voltage V(VCc).

The sensor 300' has one or more additional windings L3, chokes L3 or coils L3 which are magnetically coupled to the filter choke L2, 203c, 204c of the intermediate circuit filter 207c, for example by winding on a common ferrite core or toroid. The coils L2, 203c, 204c and L3 then form a transformer. If no filter choke L2 is present in the intermediate circuit 100' or in the intermediate circuit filter 207c, this may be installed afterwards in the feed line 103', 104', 103c, 104c, for example, by leading at least one of the feed lines 103c, 104c through a toroid.

In addition to the magnetic or noncontact coupling of the coils L2, 203c, 204c, one connection of the filter coil L2, 203c, 204c in the connection VCc is coupled to one connection of the sensor coil L3. In the connection VCc, the connections of the filter coil L2 and the sensor coil L3 are also connected to a connection of the filter capacitor C, 205c. The other connection of the filter capacitor C, 205c is connected to the second sensor connection Mc. To the second connection of the sensor coil L3, 302 is hooked up at least one connection of a sensor capacitor C3, 303 in series with the sensor coil L3, 302. The sensor coil L3, 302 and the sensor capacitor C3, 303 thus form a series oscillatory circuit. A second connection of the sensor capacitor C3, 302 is connected to the anode of a feedback diode D1, 304. The cathode of the feedback diode D1, 304 is connected to the connection VCc. Using the feedback diode D1, 304, a current picked up and amplified by means of the sensor coil L3, 302 from the intermediate circuit 100' and especially from the intermediate circuit filter 207c can be impressed in the connection VCc. The anode of the feedback diode D1, 304 is also connected to the cathode of a connection diode D2, 305. The anode of the connection diode is connected to the second connection Mc. Consequently, the first connection VCc and the second connection Mc are joined together across the feedback diode D1, 304 and the connection diode D2, 305. In an installed state, in which the interference suppressor 300 is hooked up in parallel with the intermediate circuit filter capacitor C, 305, the connection diode D2, 305 is hooked up substantially in parallel with the intermediate circuit filter capacitor C, 305. The second connection is connected to the connection Nc and to a reference potential or ground when the interference suppressor is connected to the intermediate circuit filter.

The sensor capacitor C3, 303 can be realized from a plurality of substantially parallel connected capacitors C3, C4. The diodes D1, 304, D2, 305 may be realized individually or also as a plurality of diodes D1, D2, D3, D4.

In the example shown in FIG. 3, the windings of the coils L2, 203c, 204c and L3, 302 form a transformer with a certain coupling factor k, such as k=0.9. An external periodic interference $V_{AC}$, which is caused by the interference source B1a, 206a, produces a resonant voltage surge across L2 and due to the coupling consequently also across L3. If the interference voltage produced is sufficiently large and if the voltage transformation resulting from the ratio of the number of winding turns of the coupled coils L3, 302, L2, 203c, 204c of the transformer formed by them is also sufficiently large, a periodic current begins to flow across the sensor capacitor C3, 303 and the sensor diodes 304, D1, 305, D2. This current induced in the sensor 300', which is proportional to the superimposed interference $V_{AC}$ in the direct current circuit 100' and especially to the interference VAC in the intermediate circuit filter 207c, is impressed in the connection VCc and limits the resonant voltage surge $V_{AC}$ arising from the resonance in that the impressed current diverts the energy which is generated by the transformer coupling in the sensor into the intermediate circuit 100' and especially into the intermediate circuit filter 207c.

In other words, for example the voltage V(V2c) coming from the intermediate circuit by a superimposition of the periodic interference VAC of the interference source B1a, 206a and the d.c. voltage VB comprises the function V(V2c) =VB+$V_{AC}$=900V+20V*[sin(□)2πft). The interference $V_{AC}$ here oscillates about the working point 900 V. This interference acts in a direction from the intermediate circuit 100' in the direction of the component 102c, which is connected to the connections VCc and Mc, on the intermediate circuit filter 207c, even though this filter 207c is originally provided to dampen interference propagating from the component 102c to the intermediate circuit 100'. In the region of the resonance frequency, the resulting voltage on the connection pair VCc, Mc responds with an increasing of the amplitude, resulting in an increased current in the intermediate circuit filter coil L2, 203c, 204c. The transformer only transmits the periodic portion of the increased voltage present at VCc. The winding ratio is for example 1:20. Consequently, the increased voltage will be transmitted with a corresponding voltage transformation to the sensor 300'. But since the coils L2, 203c, 204c and L3, 302 have the common connection VCc, the voltage induced in the sensor does not fluctuate about the working point of the intermediate circuit 100, 100' of 900 V, but only around the center potential between 0 and +900 V, i.e., 450 V. As long as the induced voltage does not surpass this 450 V, the diodes 304, 305 do not become conducting. If the induced voltage across L3 becomes larger than 450 V—i.e., the voltage across L2 is greater than 450 V/20=22.5 V—the diodes 304, 305 then begin to conduct and carry away some of the energy stored in the oscillation to the intermediate circuit 100'. The winding ratio is chosen such that even for the smallest occurring intermediate circuit voltage, only the overshooting is limited by the diodes. Upon occurrence of the largest specified interference voltage $V_{AC}=V_{ripple}$ the limiting should not become active if the filter oscillatory circuit 207c is not excited.

In a precise example, the following dimensioning can be used. In the example, let $V_{ripple}=16$ Vpk (peak voltage) and $V_{DCmin}=450$ VDC (voltage of the direct current portion) and let us assume a number of winding turns $n_3$ of the coil L3 and $n_2$ of the coil L2:

$$\frac{n_3}{n_2} = \sqrt{\frac{L_3}{L_2}} \approx \frac{V_{DCmin}}{\sqrt{2} \cdot V_{ripple}} = \frac{450 \text{ V}}{\sqrt{2} \cdot 16 \text{ V}_{pk}} \approx 20$$

This gives a winding ratio of 1:20. L2 and C are already predetermined by the dimensioning of the component and the corresponding intermediate circuit filter 207c. A coupling k=0.9 may give a good result, and C3 is chosen such that the smallest possible choke current results over all working points from L2, 203c, 204c. A good result can be achieved, for example, if C3 is chosen such that:

$$C_3 \cdot L_3 \approx 1,6 \cdot C \cdot L_2 \text{ i.e. } C_3 \approx C \cdot 1,6 \cdot \left(\frac{n_2}{n_3}\right)^2$$

Table 1 shows the dimensioning of the constituents of the circuit from FIG. 3. Here, C3 is determined in accordance with the above indicated dimensioning rules.

TABLE 1

| Ri | 100 mΩ | L0 | 2.5 μH |
|---|---|---|---|
| Vbatt | 900 V | L1 | 2.5 μH |
| C | 20 μF | L2 | 26.35 μH |
| C3 | 80 nF | L3 | 10.54 mH |

Figure 4:
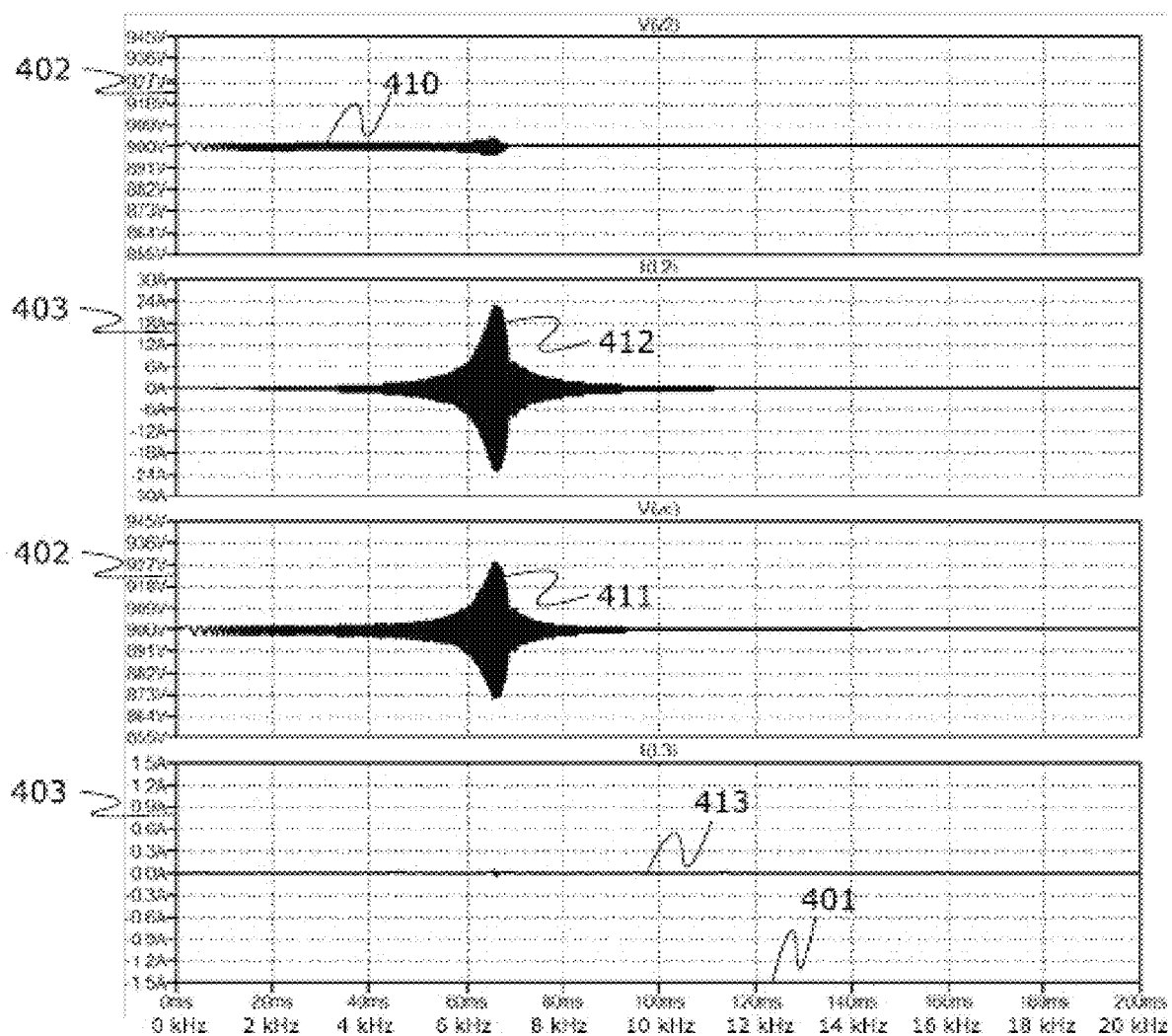
FIG. 4 shows a selection of frequency diagrams for an interference signal with a slight interference amplitude according to one exemplary sample embodiment of the present invention.

FIG. 4 shows a selection of four frequency diagrams 400 for an interference signal with a low interference amplitude according to one exemplary sample embodiment of the present invention. For the simulation, the circuit of FIG. 3, representing an equivalent circuit for a real intermediate circuit in an electric vehicle, is subjected to a constant interference amplitude of 2 V and variable frequency. In the diagram 400, the frequency is plotted on the abscissa 401 from 0 ms to 200 ms or 0 to 20 kHz. The abscissa can be calibrated in milliseconds (ms), while the values may be converted into the corresponding frequency by means of the conversion factor 1 kHz/10 ms, so that a frequency range from 0 Hz to 20 kHz is represented on the abscissa. The voltage ordinate 402 indicates voltage values in the range of 855 V to 945 V. The current ordinate 403 indicates current values from −30 A to +30 A.

In order to represent influences with variable frequency, the sweep function $$V(V2c) = 900 \text{ V} + 2 \text{ V} * \left[\sin(2\pi * 50000\frac{1}{s^2}t^2)\right]$$

is imposed at the connection V2c. The curve of the interference voltage V(V2c), 410 is plotted in FIG. 4. The interference amplitude of the interference voltage is $V_{AC}=2$ V in particular $V_{ripple}=2$ Vpk. The voltage curve V(VCc), 411 at the filter output at the component connections VCc, Mc across the intermediate circuit capacitor C, 205c shows that, even though a resonance and especially also a current and voltage surge is formed in the region of 6.5 kHz, only a nondamaging voltage amplitude of 35 V remains on account of the slight excitation with an interference amplitude of 2 V. Therefore, the interference suppressor is not utilized, since a maximum allowable voltage at the connections VCc, Mc is not surpassed.

Likewise, the current I(L2), 412 across L2 remains below 24 A. The current through L3 I(L3), 413 remains substantially constant, as curve 413 shows, being evaluated with a factor of 10.

Figure 5A:
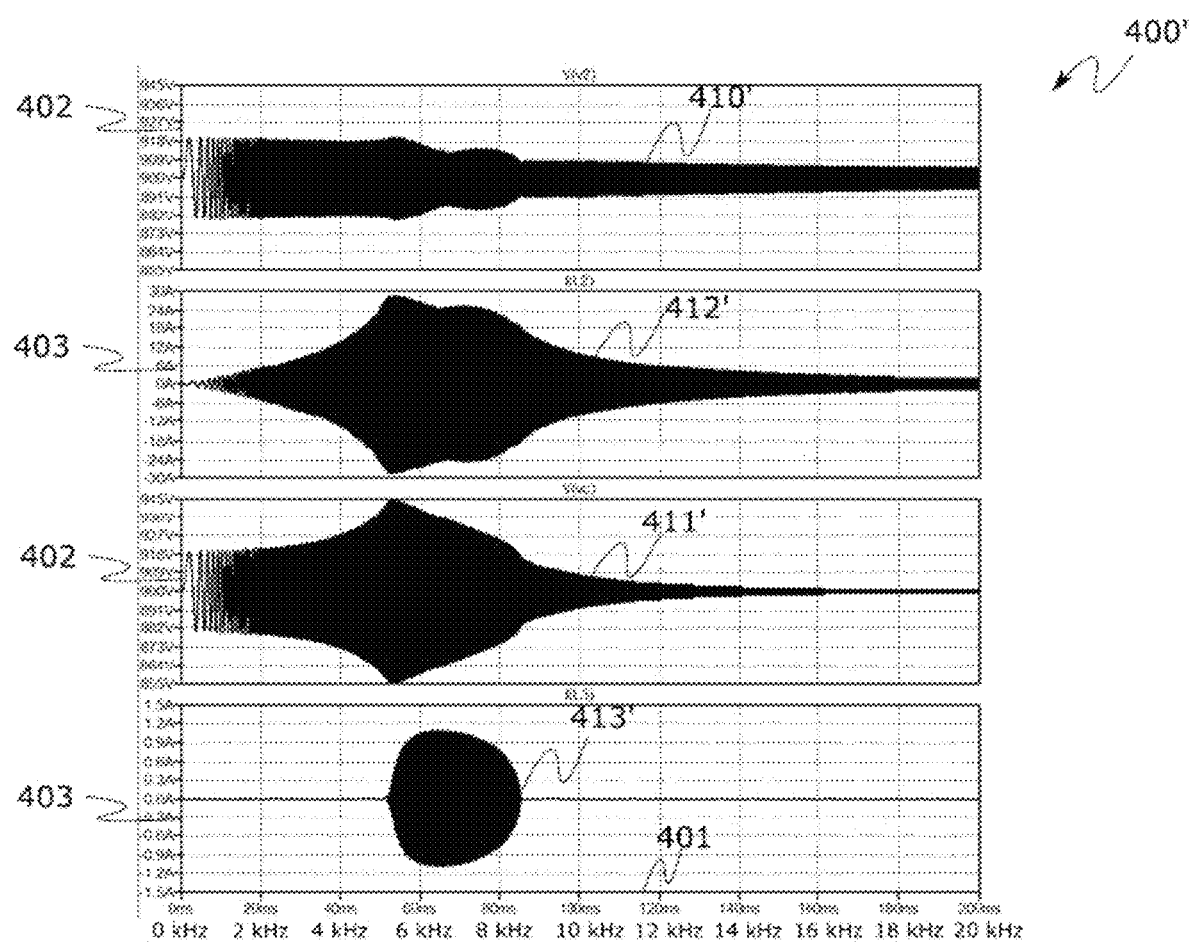
FIG. 5a shows a selection of frequency diagrams for an interference signal with a large interference amplitude at 900 V intermediate circuit voltage according to one exemplary sample embodiment of the present invention.

FIG. 5a shows a selection of frequency diagrams 400' for an interference signal with a large interference amplitude at 900 VDC intermediate circuit voltage according to one exemplary sample embodiment of the present invention. The sweep function $$V(V2c) = 900 \text{ V} + 20 \text{ V} * \left[\sin(2\pi * 50000\frac{1}{s^2}t^2)\right]$$

is imposed on the connection V2c, i.e., with a tenfold interference amplitude as compared to the interference voltage of FIG. 4. The curve of the interference voltage V(V2c), 410' is drawn in FIG. 5a. The voltage curve V(VCc), 411' at the filter output at the component connections VCc, Mc across the intermediate circuit capacitor C, 205c shows that, even though a resonance and especially also a current and voltage surge is formed in a broad frequency region once again around 6.5 kHz, this is limited on account of the operation of the interference suppressor 300 to a voltage amplitude of 45 V, i.e., from 855 V to 945 V. As compared to FIG. 4, due to the working of the interference suppressor the focus of the resonance has been shifted to a somewhat lower frequency. As already mentioned, a good result can be achieved with the above indicated dimensioning for C3. Thus, it can be ensured that a component connected at VCc is not loaded with a voltage amplitude of more than 45 V, for example if it is required that no larger loads should occur over the frequency range from 0 Hz to 20 kHz, or that larger loads should be avoided.

The current I(L2), 412' through the coil L2 remains below 30 A across the entire frequency region. The trend of the current curve I(L3), 413' shows that, in a region from 5.2 kHz to 8.6 kHz, a high current flows through L3 and therefore the interference suppressor becomes active. Without the involvement of the interference suppressor, the voltage amplitude V(VCc), 411' in the frequency region around 6.5 kHz would reach a voltage amplitude of 350 V, such that a component connected to VCc might be destroyed. In the example of FIG. 4, the interference suppressor does not operate on account of the low excitation voltage. Due to the 10-fold excitation as compared to the excitation function $$V(V2c) = 900\ V + 2\ V * \left[\sin([\ ]2\pi * 50000 \frac{1}{s^2} t^2)\right]$$

used in FIG. 4, without the presence of the interference suppressor 300 there would also be a 10-fold voltage, since the system without interference suppressor behaves in linear fashion due to the fact that it comprises only linear constituents.

Figure 5B:
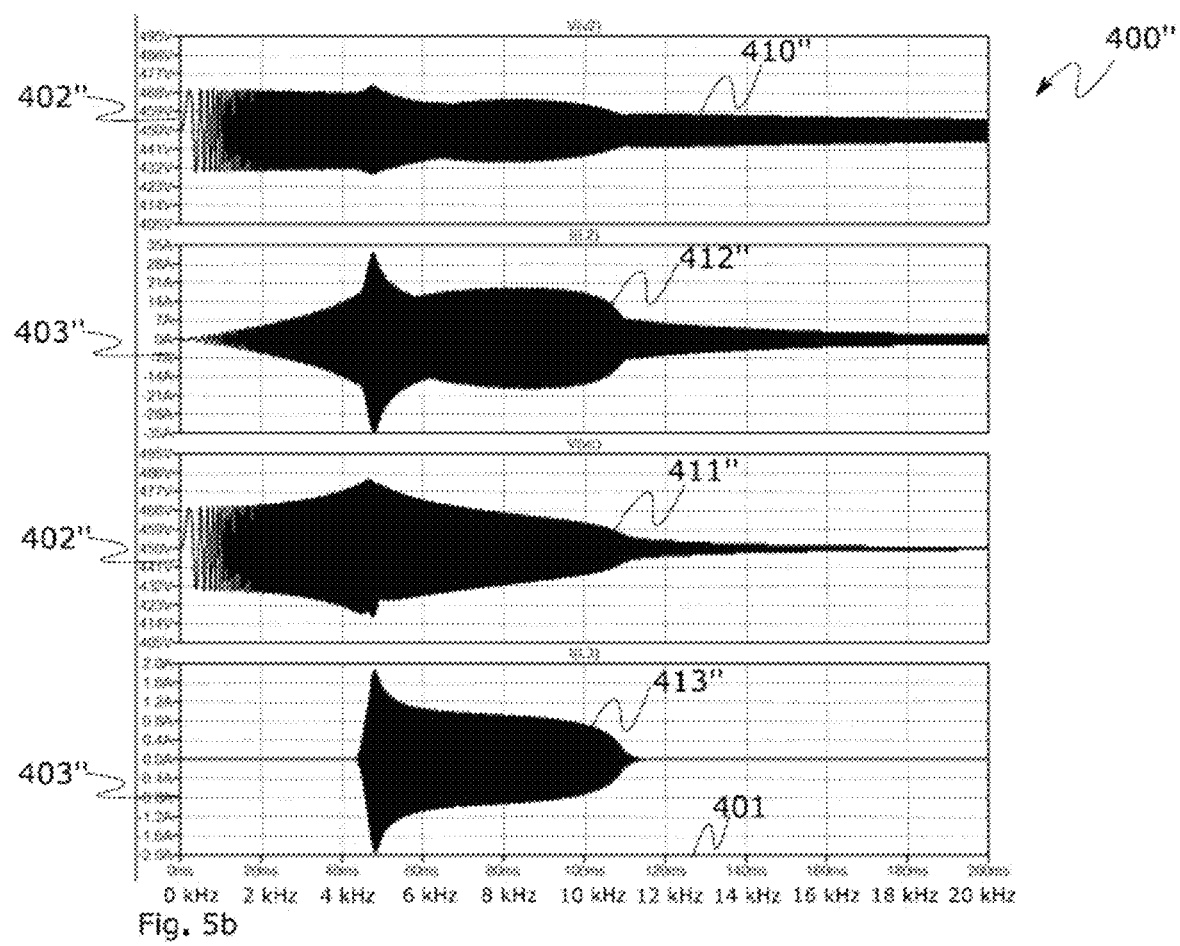
FIG. 5b shows a selection of frequency diagrams for an interference signal with a large interference amplitude at 450 V intermediate circuit voltage according to one exemplary sample embodiment of the present invention.

FIG. 5b shows a selection of frequency diagrams 400" for an interference signal with a large interference amplitude at 450 V intermediate circuit voltage according to one exemplary sample embodiment of the present invention. The voltage ordinate 402" indicates voltage values in the range of 405 V to 495 V. The current ordinate 403" indicates current values from −35 A to +35 A. The sweep function is imposed at the connection V2c, i.e., with a tenfold interference amplitude of 20 V as compared to the interference voltage of FIG. 4, but with a lower working point of 450 VDC. The curve of the interference voltage V(V2c), 410" is drawn in FIG. 5b. The voltage curve V(VCc), 411" at the filter output at the component connections VCc, Mc across the intermediate circuit capacitor C, 205c shows that, even though a resonance and especially also a current and voltage surge is formed in a broad frequency region once again around 6.5 kHz, this is limited on account of the operation of the interference suppressor 300 to a voltage amplitude of 30 V, i.e., from 420 V to 480 V. As compared to FIG. 4, due to the working of the interference suppressor the focus of the resonance has been shifted to a somewhat lower frequency. As already mentioned, a good result can be achieved with the dimensioning $$C_3 \approx C \cdot 1,6 \cdot \left(\frac{n_2}{n_3}\right)^2.$$

Thus, it can be ensured that a component connected at VCc is not loaded with a voltage amplitude of more than 36 V, for example if it is required that no larger loads should occur over the frequency range from 0 Hz to 20 kHz, or that larger loads should be avoided across this region.

The current I(L2), 412" through the coil L2 remains below 35 A across the entire frequency region and is somewhat larger in a narrow frequency region than a corresponding value of curve 412' in FIG. 5a. The trend of the current curve I(L3), 413" shows that a higher current flows through L3 in a region from 4.5 kHz to 11 kHz and therefore the interference suppressor becomes active. Without the intervention of the interference suppressor, the voltage amplitude V(VCc), 411" in the frequency region about 6.5 kHz would reach a voltage amplitude of 350 V, such that a component connected to VCc might be destroyed. In the example of FIG. 4, the interference suppressor does not operate on account of the low excitation voltage. Due to the 10-fold excitation as compared to the excitation function $$V(V2c) = 900\ V + 2\ V * \left[\sin([\ ]2\pi * 50000 \frac{1}{s^2} t^2)\right]$$

used in FIG. 4, without the presence of the interference suppressor 300 there would also be a 10-fold voltage, since the system without interference suppressor behaves in linear fashion, since it comprises only linear constituents.

Figure 6:
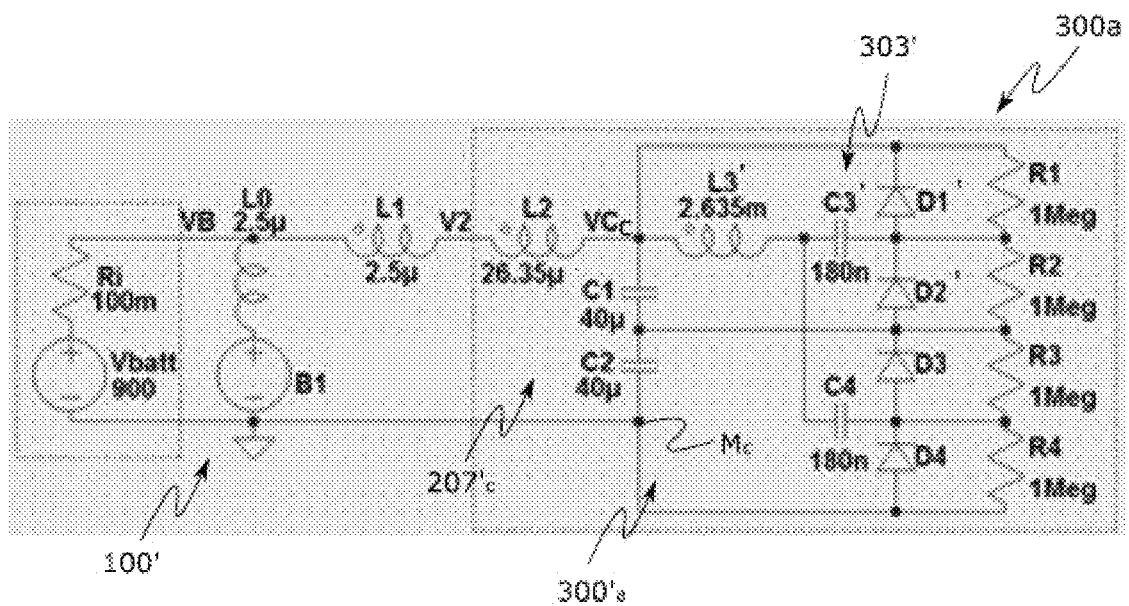
FIG. 6 shows an equivalent circuit for another embodiment of an interference suppressor with multiplied elements according to one exemplary sample embodiment of the present invention.

FIG. 6 shows another embodiment of an interference suppressor 300a according to an exemplary sample embodiment of the present invention. This embodiment enables the use of low-cost components for the sensor 300'a. The winding ratio is 1:10 so that a coil L3 with a lower inductance can be used, which can be manufactured more favorably. However, the coupling factor as in FIG. 3 amounts to k=0.9. The capacitor C3, 303 is replaced by a capacitor pair 303', C3', C4 and instead of the diodes D1, D2 there are four diodes D1', D2', D3, D4 used, being arranged in a series circuit. In parallel with each of the diodes there is hooked up a resistor R1, R2, R3, R4.

The intermediate circuit filter 207c' also has a different layout than the intermediate circuit filter 207c of FIG. 3. Instead of the capacitance C, there is used a series circuit of the capacitors C1, C2, in order to connects the anode of the diode D2' and the cathode of the diode D3 between the connection of the capacitors C1, C2.

The resistors R1, R2, R3, R4 are optional, but they can be used to assure the convergence during a simulation. Even though the layout of the interference suppressor 300a in FIG. 6 differs from the layout of the interference suppressor 300 in FIG. 3, the basic mode of functioning of the interference suppressors 300, 300a is substantially the same. However, in the interference suppressor 300a thanks to the series connection of two diode half-bridges D1' D2' and D3, D4 only half the voltage is required at L3' as compared to the voltage at L3, 302, in order for the circuit 300a to operate. Accordingly, the number of winding turns of L3' of the interference suppressor 300a can be cut in half as compared to the number of winding turns of L3, 302, of the interference suppressor 300. With a coupling of k=0.9, good results can be achieved and the capacitances of the capacitors C3' and C4 are chosen such that C3'=C4 and that the smallest possible choke current from L2 results over all working points. The capacitors C3' and C4 are connected at a common connection both to each other and also to a connection of the coil L3'. The other connection of the capacitor C3' is connected to an anode of the diode D1' and a cathode of the diode D2'. The diodes D1' and D2' form a diode half-bridge. The other connection of the capacitor C4 is connected to an anode of the diode D3 and a cathode of the diode D4. The diodes D3 and D4 form another diode half-bridge. A good result can be achieved by choosing C3'=C4, the values of C3' and C4 being chosen such that when C1=C2 the following condition is fulfilled:

$$C'_3 \approx C_1 \cdot 1,8 \cdot \left(\frac{n_2}{n_3}\right)^2$$

Table 2 gives the dimensioning of the components of the circuit from FIG. 6. From this dimensioning according to Table 2 one can see that the conditions C1=C2 and C3'=C4 are fulfilled. Furthermore, the values of the capacitors C3' and C1 stand in the above indicated relationship.

TABLE 2

| Ri | 100 mΩ | L0 | 2.5 µH |
|---|---|---|---|
| Vbatt | 900 V | L1 | 2.5 µH |
| C1 | 40 µF | L2 | 26.35 µH |

TABLE 2-continued

| C2 | 40 µF | L3' | 2.635 mH |
| C3' | 180 nF | R1 = R2 = R3 = R4 | 1 MΩ |
| C4 | 180 nF | | |

In addition, it should be pointed out that "comprising" and "having" does not rule out any other elements or steps and the "a" or "one" does not rule out a plurality. Moreover, it should be noted that features or steps which are described with reference to one of the above sample embodiments can also be used in combination with other features or steps of other sample embodiments described above. Reference numbers in the claims are not to be viewed as a limitation.

The invention claimed is:

1. An interference suppressor (300, 300a) for a direct current circuit (100, 100'), comprising two conductors (103', 103c, 104', 104c),
wherein the interference suppressor (300, 300a) comprises:
a first connection (VCc) for connecting the interference suppressor (300, 300a) to a first conductor (103', 103c) of the direct current circuit (100, 100');
a second connection (Mc) for connecting the interference suppressor (300, 300a) to a second conductor (104', 104c) of the direct current circuit (100, 100'); and
a sensor (300', 300a'), wherein the sensor:
can be coupled in noncontact manner to the direct current circuit (100, 100');
is designed to detect the passing of a predetermined limit value of a superimposed alternating voltage in the first conductor (103', 103c) of the direct current circuit; and
is designed, by impressing a current in the first connection (VCc), to reduce the alternating voltage in the first conductor of the direct current circuit substantially to the predetermined limit value,
wherein the sensor (300', 300a') for the noncontact coupling to the first conductor of the direct current circuit comprises a coil (302, L3, L3') in order to form, with the direct current circuit (100, 100'), a transformer with a predetermined coupling factor (k), and
wherein a first connection (VCc) of the coil (L3, L3') is connected to the first connection (VCc) and a second connection of the coil (L3, L3') is connected across at least one capacitor (303, C3, C3', C4) and across at least one diode (D₁, 304, D₂, 305, D1', D2', D3, D4) to the first connection (VCc).

2. The interference suppressor (300, 300a) as claimed in claim 1, wherein a connection of the at least one capacitor (C3, C3', C4) is connected across a further diode (D2, D4) to the second connection.

3. The interference suppressor (300, 300a) as claimed in claim 1, wherein the first connection (VCc) and the second connection (Mc) is designed for connecting to a vehicle component (102a, 102b, 102c, 102d).

4. The interference suppressor (300, 300a) as claimed in claim 1, wherein the direct current circuit comprises a filter coil (L2) and/or a power inductance, to which the sensor (300', 300a') can be coupled in noncontact manner.

5. The interference suppressor (300, 300a) as claimed in claim 1, wherein the direct current circuit (100, 100') has a d.c. voltage of 400 V or 900 V.

6. The interference suppressor (300, 300a) as claimed in claim 1, further comprising: a housing; wherein the housing is designed for fastening to a vehicle.

7. A component (102a, 102b, 102c, 102d) comprising:
a direct current circuit (100, 100') with a first conductor (103', 103c), a second conductor (104', 104c) and an intermediate circuit filter (207c, 207c');
an interference suppressor (300, 300a) as claimed in claim 1; wherein
the first connection (VCc) of the interference suppressor is connected to the first conductor (103', 103c);
the second connection (Mc) of the interference suppressor is connected to the second conductor (104', 104c);
the sensor (300', 300a') is coupled in noncontact manner to the intermediate circuit filter (207c, 207c'); and
the direct current circuit is designed for connecting to a high-voltage intermediate circuit.

8. A vehicle comprising at least one object chosen from among:
the interference suppressor;
the component as claimed in claim 7; or
a high-voltage intermediate circuit for a vehicle comprising:
a power supply battery,
a first component, which is operated with a working frequency,
at least one second component,
at least one of the interference suppressor, wherein
the power supply battery, the first component and the second component are respectively connected to a first conductor and a second conductor of the high-voltage intermediate circuit,
the first conductor of the at least one second component is connected to the first connection (VCc) of the interference suppressor,
the second conductor of the at least one second component is connected to the second connection of the interference suppressor, and
the sensor of the interference suppressor is coupled in noncontact manner to the part of the first conductor and/or second conductor belonging to the at least one second component.

9. A high-voltage intermediate circuit (100, 100') for a vehicle comprising:
a power supply battery (101);
a first component (102a), which is operated with a working frequency;
at least one second component (102b, 102c, 102d);
at least one interference suppressor as claimed in claim 1; wherein
the power supply battery, the first component and the second component are respectively connected to a first conductor and a second conductor of the high-voltage intermediate circuit;
the first conductor of the at least one second component is connected to the first connection (VCc) of the interference suppressor;
the second conductor of the at least one second component is connected to the second connection of the interference suppressor; and
the sensor (300', 300a') of the interference suppressor is coupled in noncontact manner to the part of the first conductor and/or second conductor belonging to the at least one second component.

10. A component (102a, 102b, 102c, 102d) comprising:
a direct current circuit (100, 100') with a first conductor (103', 103c), a second conductor (104', 104c) and an intermediate circuit filter (207c, 207c'); and an interference suppressor (300, 300a) for a direct current circuit (100, 100'), comprising two conductors (103', 103c, 104', 104c), wherein the interference suppressor (300, 300a) comprises:
- a first connection (VCc) for connecting the interference suppressor (300, 300a) to a first conductor (103', 103c) of the direct current circuit (100, 100');
- a second connection (Mc) for connecting the interference suppressor (300, 300a) to a second conductor (104', 104c) of the direct current circuit (100, 100'); and
- a sensor (300', 300a'), wherein the sensor:
  - can be coupled in noncontact manner to the direct current circuit (100, 100');
  - is designed to detect the passing of a predetermined limit value of a superimposed alternating voltage in the first conductor (103', 103c) of the direct current circuit;
  - is designed, by impressing a current in the first connection (VCc), to reduce the alternating voltage in the first conductor of the direct current circuit substantially to the predetermined limit value; and
  - is coupled in noncontact manner to the intermediate circuit filter (207c, 207c').

11. A high-voltage intermediate circuit (100, 100') for a vehicle comprising:
- a power supply battery (101);
- a first component (102a), which is operated with a working frequency;
- at least one second component (102b, 102c, 102d); and
- at least one interference suppressor (300, 300a) for a direct current circuit (100, 100'), comprising two conductors (103', 103c, 104', 104c), wherein:
- the power supply battery, the first component and the second component are respectively connected to a first conductor and a second conductor of the high-voltage intermediate circuit;
- the first conductor of the at least one second component is connected to the first connection (VCc) of the interference suppressor; and
- the second conductor of the at least one second component is connected to the second connection of the interference suppressor, and wherein the at least one interference suppressor (300, 300a) comprises:
- a first connection (VCc) for connecting the interference suppressor (300, 300a) to a first conductor (103', 103c) of the direct current circuit (100, 100');
- a second connection (Mc) for connecting the interference suppressor (300, 300a) to a second conductor (104', 104c) of the direct current circuit (100, 100'); and
- a sensor (300', 300a'), wherein the sensor:
  - can be coupled in noncontact manner to the direct current circuit (100, 100');
  - is designed to detect the passing of a predetermined limit value of a superimposed alternating voltage in the first conductor (103', 103c) of the direct current circuit; and
  - is designed, by impressing a current in the first connection (VCc), to reduce the alternating voltage in the first conductor of the direct current circuit substantially to the predetermined limit value.

\* \* \* \* \*